(12) United States Patent
Ben Bakir et al.

(10) Patent No.: US 9,077,152 B2
(45) Date of Patent: Jul. 7, 2015

(54) LASER DEVICE HAVING A LOOPED CAVITY CAPABLE OF BEING FUNCTIONALIZED

(75) Inventors: Badhise Ben Bakir, Brezins (FR); Antoine Descos, Grenoble (FR); Jean-Marc Fedeli, Saint-Egreve (FR); Nicolas Olivier, Teche (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/131,497

(22) PCT Filed: Jul. 11, 2012

(86) PCT No.: PCT/FR2012/000286
§ 371 (c)(1),
(2), (4) Date: Jan. 8, 2014

(87) PCT Pub. No.: WO2013/007896
PCT Pub. Date: Jan. 17, 2013

(65) Prior Publication Data
US 2014/0161146 A1    Jun. 12, 2014

(30) Foreign Application Priority Data
Jul. 11, 2011    (FR) ...................................... 11 02181

(51) Int. Cl.
*H01S 5/00* (2006.01)
*H01S 5/323* (2006.01)
*H01S 5/10* (2006.01)
(Continued)

(52) U.S. Cl.
CPC ............... *H01S 5/323* (2013.01); *H01S 5/0206* (2013.01); *H01S 5/026* (2013.01); *H01S 5/0265* (2013.01); *H01S 5/1032* (2013.01); *H01S 5/1071* (2013.01); *H01S 5/1014* (2013.01)

(58) Field of Classification Search
CPC ...... H01S 5/101; H01S 5/1003; H01S 5/3013
USPC .................... 372/45.012, 50.22, 64
See application file for complete search history.

(56) References Cited

U.S. PATENT DOCUMENTS 4,002,997 A     1/1977 Thompson
5,793,913 A *   8/1998 Kovacic ........................ 385/49

(Continued)

FOREIGN PATENT DOCUMENTS

EP    2 337 167 A1    6/2011
FR    2 290 059 A1    5/1976

(Continued)

OTHER PUBLICATIONS

Fang et al., "Integrated AlGaInAs-Silicon Evanescent Racetrack Laser and Photodetector," *Optics Express*, Mar. 5, 2007, vol. 15, No. 5, pp. 2315-2322.

(Continued)

*Primary Examiner* — Xinning Niu
*Assistant Examiner* — Vu A Vu
(74) *Attorney, Agent, or Firm* — Oliff PLC

(57) ABSTRACT

The laser device includes an amplifier including a III-V heterostructure arranged to generate photons, and a waveguide which forms a loop and is optically coupled to the amplifier. The amplifier is arranged facing the waveguide only in the region of a first section of the waveguide.

10 Claims, 6 Drawing Sheets

(51) Int. Cl.
*H01S 5/02* (2006.01)
*H01S 5/026* (2006.01)

(56) References Cited

U.S. PATENT DOCUMENTS

| | | | |
|---|---|---|---|
| 7,260,279 B2* | 8/2007 | Gunn et al. | 385/2 |
| 7,894,418 B2* | 2/2011 | Krug et al. | 370/351 |
| 2003/0219045 A1 | 11/2003 | Orenstein et al. | |
| 2008/0273567 A1* | 11/2008 | Yariv et al. | 372/50.1 |
| 2009/0016399 A1* | 1/2009 | Bowers | 372/50.21 |
| 2009/0028492 A1 | 1/2009 | Wu et al. | |
| 2009/0116523 A1 | 5/2009 | Leem et al. | |
| 2010/0098129 A1* | 4/2010 | Furuyama | 372/94 |
| 2010/0246617 A1 | 9/2010 | Jones | |
| 2011/0150024 A1 | 6/2011 | Dupont et al. | |

FOREIGN PATENT DOCUMENTS

| | | |
|---|---|---|
| GB | 2 391 692 A | 2/2004 |
| WO | WO 2004/088801 A2 | 10/2004 |

OTHER PUBLICATIONS

Soldano et al., "Optical Multi-Mode Interference Devices Based on Self-Imaging: Principles and Applications," *Journal of Lightwave Technology*, Apr. 1995, vol. 13, No. 4, pp. 615-627.

Roelkens et al., "Hybrid Silicon Lasers," *Proc. of SPIE*, Jan. 2011, vol. 7942, pp. 79420D-1-79420D-9.

Liu et al., "Low-Power Electro-Optical Switch Based on III-V Microdisk Cavity on a Silicon-on-Insulator Circuit," *SPIE-OSA-IEEE*, 2009, vol. 7631, pp. 76310P-1-76310P-6.

Xu et al., "Theoretical Analyses on Short-Term Stability of Semiconductor Fiber Ring Lasers," *IEEE Journal of Quantum Electronics*, Oct. 2003, vol. 39, No. 10, pp. 1260-1265.

Ben Bakir et al., "Hybrid Si/III-V Lasers with Adiabatic Coupling," Group IV Photonics (GFP), 2011 8th IEEE international Conference, Sep. 14, 2011, pp. 169-171.

International Search Report issued in International Patent Application No. PCT/FR2012/000286 dated Nov. 13, 2012.

* cited by examiner

LASER DEVICE HAVING A LOOPED CAVITY CAPABLE OF BEING FUNCTIONALIZED

BACKGROUND OF THE INVENTION

The invention relates to a laser device comprising:
an amplifier comprising a III-V heterostructure arranged to generate photons,
a waveguide which forms a loop and is optically coupled to the amplifier.

STATE OF THE ART

Photonics on silicon (CMOS) addresses a large number of fields of application such as optic interconnections in integrated circuits, telecommunications, biophotonics, etc.

Integration of III-V materials with silicon is at present considered as an approach enabling emission characteristics hitherto inaccessible to silicon to be achieved.

In general, a laser device can comprise an amplifier with a III-V heterostructure optically coupled to a silicon waveguide. The resonant cavity of this device is formed by mirrors arranged at the level of the waveguide on each side of the amplifier.

The document "Integrated AlGaInAs-silicon evanescent race track laser and photodetector" by Alexander W. Fang published on 5 Mar. 2007 in volume 15 number 5 of Optic Express pages 2315 to 2322 describes a laser device using a cavity of ring/loop type. In this document, and as illustrated in FIG. 1, silicon waveguide 2 is in the form of a ring coupled over its whole length with an amplifier 1 formed by a III-V heterostructure, also in the form of a ring, and added to said ring forming silicon waveguide 2. Waveguide 2 is optically coupled by codirectional coupling to an output waveguide 3 enabling a laser beam to be extracted. Output waveguide 3 is also always covered by the III-V heterostructure.

This type of laser device is limited to generating a laser beam and to sending it to an output waveguide. Its modal gain is furthermore relatively low.

US Patent application 2009/028492 describes an optic resonator comprising an amplifying laser structure and several segments of optic waveguides connected to one another with total internal reflection mirrors to form a closed loop. The laser structure comprises a stack of layers made from III-V semiconducting material.

OBJECT OF THE INVENTION

The object of the invention consists in providing a compact, high-performance laser device enabling functionalization of said waveguide.

This object is achieved by the fact that the amplifier is arranged facing the waveguide only in the region of a first section of said waveguide and in that it comprises a first mode transformer and a second mode transformer, each formed in the waveguide at a respective end of the first section so as to perform optic coupling between the waveguide and the amplifier. The width of the first section can be smaller, at least over a portion of the latter, than the width of said waveguide on each side of said first section, the contraction generated delineating the first and second mode transformers.

According to a functionalization of the device, the waveguide comprises a second section distinct from the first section and forming a microresonator to perform mode filtering.

Advantageously, the microresonator can comprise a modulation system of its effective index.

According to an alternative embodiment, the second section is in the form of a ring or a disk optically coupled to third and fourth sections of the waveguide distinct from the first section.

Advantageously, the second, third and fourth sections are formed in the same plane or the third and fourth sections are formed in the same plane, parallel to an offset plane comprising the second section.

According to a particular embodiment, the microresonator is a photonic crystal.

According to one embodiment, the amplifier is in the form of a loop, a single portion of the loop of the amplifier being arranged facing the first section of the waveguide.

According to one embodiment, the waveguide is coupled to a semiconductor optical amplifier over a section of the waveguide distinct from the first section.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS

The laser device described in the following differs from the prior art in particular in that it comprises mode transformers formed in the waveguide so as to achieve a more compact device having a better coupling efficiency and enabling functionalization of said waveguide.

By convention, on an optic circuit made in a given plane, transverse electric (TE) and transverse magnetic (TM) polarization states are defined such that, in the TE state, the electric field is parallel to the plane of the circuit whereas the magnetic field is perpendicular to the plane of the circuit, and in the TM state, the magnetic field is parallel to the plane of the circuit whereas the electric field is perpendicular to the plane of the circuit. In fact, in the device described in the following, a quasi-TE polarization state should preferably be implicitly considered, i.e. a very large majority of the electric field is polarized in its TE direction. The structure of the device as described will thus preferably enable coupling of TE or quasi-TE mode of an optic wave.

Figure 1:
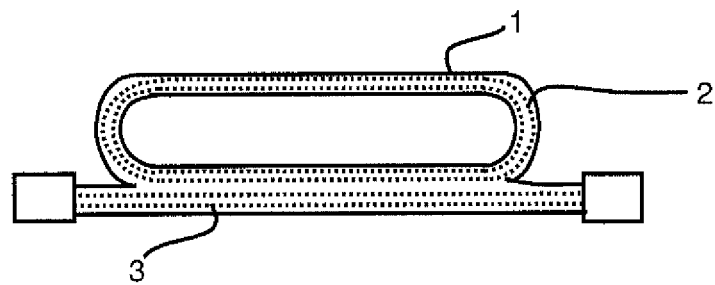
FIG. 1 illustrates a laser device in the form of a ring of the prior art.
Figure 2:
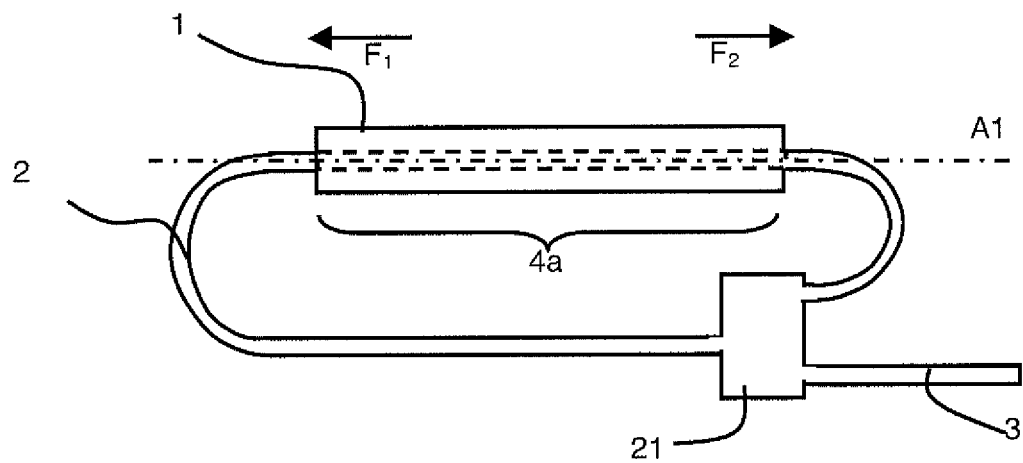
FIG. 2 illustrates an implementation of a laser device according to the invention seen in top view.

FIG. 2 illustrates a laser device comprising an amplifier 1 provided with a III-V heterostructure, the heterostructure being arranged to generate photons, thereby generating an optic wave able to propagate and to be amplified in amplifier 1. An optic wave can be composed of one or more optic modes.

The laser device further comprises a waveguide 2 optically coupled to amplifier 1. Optic coupling between amplifier 1 and waveguide 2 enables the photons generated and/or amplified in amplifier 1 to pass from amplifier 1 to waveguide 2, or vice-versa, in the form of an optic wave. Amplifier 1 is arranged facing waveguide 2 only in the region of a first section 4a of said waveguide 2. In the example of FIG. 2, waveguide 2 and amplifier 1 are arranged in offset planes, i.e. amplifier 1 is located above waveguide 2, and waveguide 2 and amplifier 1 comprise proximal surfaces enabling the optic wave to pass from one to the other. In other words, the distance separating waveguide 2 and amplifier 1 is such that optic coupling is enhanced. The separating distance can be comprised between 5 nm and 500 nm. In fact, the greater the separating distance, the greater the coupling length, everything therefore depending on the targeted application. A long device will be able to emit a large amount of power, and a short device will emit less power but will be more compact and less energy-consuming. Waveguide 2 forms a loop enabling the loop-shaped laser cavity to be defined. The photons thus pass through the loop in the clockwise and/or counter clockwise direction, without having to change direction of propagation, and are amplified, i.e. scaled up, in coherent manner at each turn by amplifier 1.

Preferably, in the region of first section 4a, amplifier 1 and waveguide 2 are rectilinear and elongate in the direction of propagation of the optic wave (arrows $F_1$ and $F_2$). The longitudinal axes of waveguide 2 and of amplifier 1 are parallel in the direction of axis A1 represented in FIG. 2.

What is meant by III-V heterostructure is the use in this heterostructure of materials able to be chosen from the following non-exhaustive list: InP, GaAs, InGaAlAs, InGaAsP, AlGaAs and InAsP.

Figure 3:
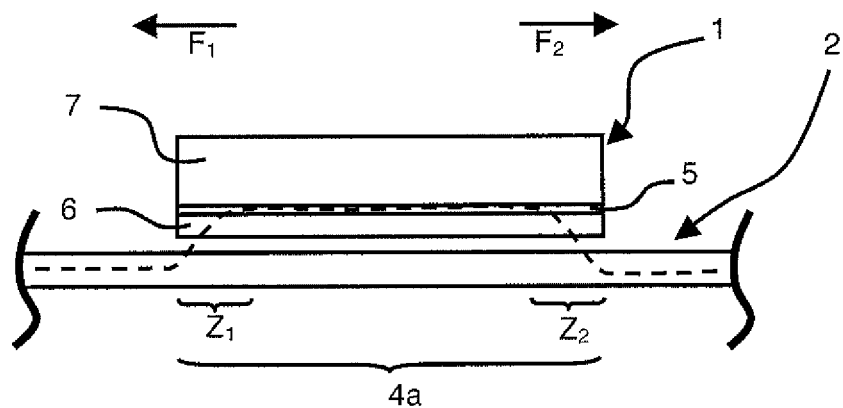
FIG. 3 illustrates a partial side view of the device of FIG. 2 centred on the amplifier.

FIG. 3 illustrates the heterostructure of such an amplifier 1, optically coupled to waveguide 2, also called gain medium. The path of the optic wave is represented by the broken lines. The heterostructure can comprise a stack comprising a layer provided with quantum elements 5 sandwiched between a first doped layer 6 (proximal to waveguide 2) that is preferably N-doped, and a second doped layer 7 that is preferably P-doped. First doped layer 6, when it is N-doped, can comprise a material essentially chosen from InP, GaAs, InGaAsP, InGaAlAs, AlGaAs and InAsP. Second doped layer 7, when it is P-doped, can comprise a material chosen from InP, GaAs, InGaAsP, InGaAlAs, AlGaAs, and InAsP. In other words, the materials used for first layer 6 and second layer 7 can be the same, only the doping changing. The doping can naturally be reversed, i.e. first doped layer 6 can be P-doped and second doped layer 7 can be N-doped. Layer of quantum elements 5 can comprise quantum wells, or quantum boxes, enabling recombination of holes and electrons to form photons, thereby generating the optic wave in the region of amplifier 1.

The quantum elements can comprise a material such as InP, GaAs, InGaAsP, InGaAlAs, AlGa, As, or InAsP. To complete amplifier 1, first and second layers 6, 7 are conventionally in electric contact with associated electrodes (not shown) enabling current to be generated and electric pumping of amplifier 1 to be performed.

In FIG. 3, certain generated photons can move in the direction of arrow $F_1$, and other generated photons can move in the direction of arrow $F_2$.

Waveguide 2 and amplifier 1 are preferably separated by a dielectric layer (not shown for the sake of clarity) in contact with both waveguide 2 and amplifier 1 at least in the region of first section 4a. In the region of first section 4a, waveguide 2 can be covered by the dielectric material of the layer. The dielectric material or materials constituting the layer separating waveguide 2 and amplifier 1 preferably have a low refractive index, for example comprised between 1.4 (index close to silica) and 2.2 (index close to $Si_3N_4$ or $Al_2O_3$). The dielectric layer advantageously facilitates production of the laser device and improves the efficiency of the coupling between amplifier 1 and waveguide 2. Refractive index is referred to when an optic wave propagating in an infinite material in three dimensions is considered, its speed of propagation being the speed of light divided by the refractive index.

The refractive index is to be differentiated from the effective index. Effective index is in fact referred to when an optic wave propagating in a particular geometry, for example a waveguide, is considered. In such a geometry, the field is impaired, which means that the speed of propagation of the wave is also impaired. The speed of propagation is equal to the speed of light over the effective index. To calculate the effective index, the finite elements method is used.

Optic coupling between first section 4a and amplifier 1 can be achieved by means of two coupling areas $Z_1$ and $Z_2$ (FIG. 3) preferably formed at the longitudinal ends of first section 4a. Each coupling area $Z_1$, $Z_2$ has a length, along the longitudinal axis of the waveguide, which is an odd multiple of coupling length $L_c$, and preferably equal to $L_c$.

The optimal coupling efficiency (F) when direct coupling is involved (i.e. without the use of mode transformers as described in the foregoing) is defined as being the fraction of power transmitted from a first guide to a second guide (here waveguide 2 to amplifier 1 and vice-versa) at the end of a characteristic distance called coupling length $L_c$:

$$F = 1 - \left(\frac{\Delta n_{eff,L}}{\Delta n_{eff,S}}\right)^2, \quad \text{with} \tag{1}$$

$$L_c = \frac{\lambda}{2\Delta n_{eff,S}}, \tag{2}$$

where:

$\lambda$: is the operating wavelength.

$\Delta n_{eff,L}$: is the difference between the effective indexes of the modes supported by the first and second guides in the absence of coupling (the guides are taken individually). These guided modes are called local modes.

$\Delta n_{eff,S}$: is the difference between the effective indexes of the modes supported by the coupling structure comprising the two juxtaposed guides. These two supermodes are by construction of opposite symmetry. Symmetric and anti-symmetric supermodes will then be referred to. This physical quantity is dependent on the distance separating the two guides. It conditions the coupling length $L_c$ as well as the transferred power ratio.

A mode of an optic wave corresponds to a spatial configuration of the electromagnetic field as defined in the above (TE or quasi-TE component). Typically, an optic wave comprises a plurality of modes. What is meant by monomode is that only one of the modes is optically coupled. When the system is coupled as in the case of the laser, supermodes are referred to.

Eigenmodes, also called local modes, are those of waveguide 2 and of amplifier 1 taken individually. Supermodes are linear combinations of the local modes.

It should be noted that power transfer from one guide to the other is a harmonic process and is therefore reversible. Considering a nominal power $P_0$ injected into the first guide, the power collected, or transmitted to the second guide at the position z, is expressed in the following manner:

$$P_{1\to 2}(z) = P_0 \cdot F \sin^2\left(\frac{\pi}{2L_c} \cdot z\right) \quad (3)$$

It can be observed according to relation (3) that the power transfer from the first guide to the second guide is optimal for odd multiples of the characteristic coupling length.

In the prior art, the optic mode of the wave is mainly confined in the silicon waveguide to the detriment of the gain provided by the III-V heterostructure. An infinitesimal part of the optic mode in fact covers the quantum wells.

In the present laser device, it is preferable to minimize the overlap length between amplifier 1 and waveguide 2 to limit the length of first section 4a so as to leave free access to other sections of waveguide 2, distinct from the first section, to functionalize it.

Thus, in comparison with the prior art, it is possible to elongate waveguide 2 so as to enable a sufficient overlap between amplifier 1 and waveguide 2 to ensure good optic coupling, while at the same time leaving the waveguide partially free to functionalize it.

Figure 4:
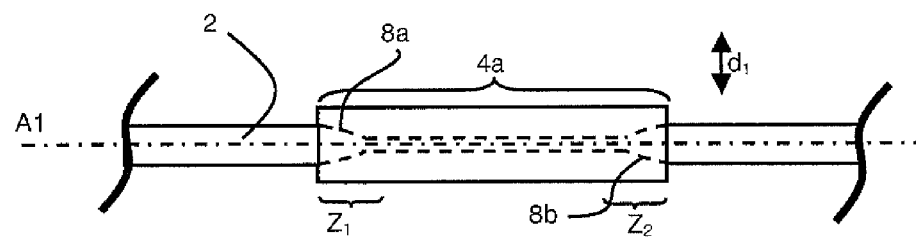
FIG. 4 illustrates a top view of FIG. 3.

According to an embodiment illustrated in FIG. 4 enabling the length of first section 4a, and therefore of waveguide 2 to be limited, the laser device comprises a first mode transformer 8a and a second mode transformer 8b. The latter 8a, 8b are each formed in waveguide 2 at a respective end of first section 4a of waveguide 2 so as to perform optic coupling. A mode transformer 8a, 8b enables at least one coupling area $Z_1$, $Z_2$ as described in the foregoing to be formed to progressively transfer the mode of the optic wave confined in amplifier 1 in optimal manner to waveguide 2, and vice-versa. Mode transformers 8a and 8b are advantageously formed only in waveguide 2, thereby facilitating production of the laser device and enabling an amplifier with good power performances to be preserved. The mode transformers then make it possible to produce a more compact device than in the prior art with a coupling efficiency of more than 95%. Furthermore, this coupling makes it possible to take maximum advantage of the gain of the quantum wells of the heterostructure unlike the prior art.

A mode transformer 8a, 8b circumvents the constraints on the dimensioning of waveguide 2 and of amplifier 1 to optimize coupling. Indeed, in order to optically couple waveguide 2 with amplifier 1 as efficiently as possible, it is possible to fabricate the latter with identical effective indexes (direct coupling). Such a fabrication does however imply a perfect alignment and dimensioning which are difficult to achieve.

In the case of direct coupling (without mode transformers) where the width of the waveguide is invariant in the direction of propagation axis A1, the effective indexes have to be strictly identical to obtain an optic coupling of the wave of 100%, which places a constraint on the definition of the width of waveguide 2 and of amplifier 1, in the region of first section 4a, to make their effective indexes match, The second constraint is that optimal coupling can only be achieved over a precise distance which is the beat length or coupling length Lc referred to in the foregoing, If the length is smaller than Lc, coupling will not be totally performed. If the length is greater than Lc, coupling will be performed over a distance Lc, as the mode will partially uncouple over the remaining distance (for a length L=2*Lc, the mode reverts to its initial state). Odd multiples of Lc greater than 1 will therefore tend to be used to increase the probability of efficient optic coupling.

The shape of waveguide 2 can then be studied so as to obtain a robust coupling with respect to the opto-geometric variations introduced when fabrication takes place. Mode transformers 8a, 8b are therefore present on the one hand to palliate possible design defects and on the other hand to ensure optimum optic coupling over a length which is preferably simply equal to coupling length Lc. To form mode transformers 8a, 8b, over at least a portion of said first section 4a, the width of first section 4a is smaller than the width of waveguide 2, on each side of first section 4a. The generated contraction delineates first and second mode transformers 8a, 8b. In FIG. 4, the width of waveguide is defined by the dimension $d_1$ perpendicular to axis A1 and comprised in the plane of the loop formed by waveguide 2. In other words, in a section of waveguide 2 formed in the plane of waveguide 2, the section comprises a contraction in the region of first section 4a.

In the case of adiabatic coupling by mode transformer, the width of waveguide 2, at one end of mode transformer 8a, 8b, is designed in such a way that the effective index of the waveguide is lower than the effective index of the amplifier (which for its part remains invariant along the direction of propagation). The opposite reasoning is applied for the width of the waveguide at another end of the mode transformer. Thus, along the whole of the mode transformer, the effective index of waveguide 2 will be lower than, equal to, and finally higher than the effective index of amplifier 2 or vice-versa. In this way, the optic power can be coupled progressively and in reversible manner, either guide to amplifier or amplifier to guide.

Figure 5:
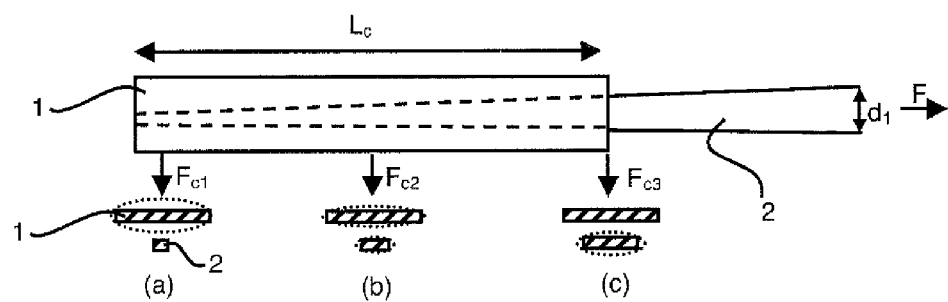
FIG. 5 illustrates the operating principle of a mode transformer.

Another advantage of mode transformers 8a, 8b is that coupling is efficient as from a certain length, and that it remains substantially identical according to the designs above this length. A mode transformer circumvents the problems related to the precision of the coupling length (which are to be found in the case of directional coupling) by using for example a length that is simply greater than or equal to Lc for the optic coupling area $Z_1$, $Z_2$ concerned. This principle is illustrated in FIG. 5, from left to right, where waveguide 2 of variable cross-section has a divergent shape in the direction of F (direction of propagation of the considered optic wave), corresponding to a variation of its lateral dimension $d_1$. Amplifier 1 arranged above waveguide 2 is of constant cross-section. An optic wave is represented by broken lines in the region of cross-sections (a), (b), (c), perpendicular to the direction of displacement F of said wave, said cross-sections being respectively indicated by arrows $F_{c1}$, $F_{c2}$, $F_{c3}$. The optic wave is first of all confined in amplifier (a), then as the cross-section of the waveguide progressively broadens (in the direction $d_1$), the effective indexes come closer to one another and the wave is coupled little by little to waveguide (b) until it is totally coupled (c) over coupling length Lc (at the beginning the effective index of waveguide 2 is lower than the effective index of amplifier 1, and a phase match is then achieved with the effective index of waveguide 2 which is then equal to the effective index of amplifier 1, and the effective index of waveguide 2 then becomes greater than the effective index of amplifier 1). Suitable patterning of waveguide 2 enables the laser device to take full advantage of the available gain, by modal transformation. This is possible as in a central part of the laser device (part between the two mode transformers 8a, 8b), the electromagnetic field (i.e. the optic wave mode) is mainly confined in the active area (amplifier medium), and overlapping with the quantum wells is maximal thereby enhancing the modal gain and enabling the threshold of the laser device to be reduced with respect to the prior art. This modal transformation is then adiabatic (without energy loss) and guarantees optimal coupling to an underlying photonic circuit. FIG. 5 illustrates a wave confined in amplifier 1 and coupling with waveguide 2, the reverse operation being possible using the same structure (wave confined in the waveguide and coupling with the amplifier).

Figure 6:
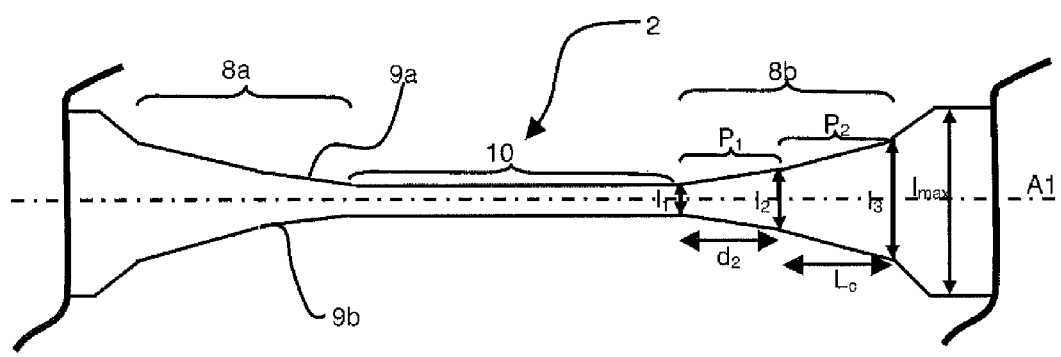
FIG. 6 illustrates a particular implementation of the first section of the waveguide with implementation with two mode transformers.

Preferably, as illustrated in FIG. 6, each mode transformer 8a, 8b can comprise a first portion $P_1$ arranged in such a way as to limit the losses generated by the diffraction process when coupling from amplifier 1 to waveguide 2 is performed, the process being reversible, the same occurring when coupling from waveguide 2 to amplifier 1. This first portion $P_1$ can be divergent (towards the right of the figure), and on this portion $P_1$, the distance separating two flanks 9a, 9b of waveguide 2 varies between $I_1$ and $I_2$, preferably with $I_1=500$ nm and $I_2=0.700$ nm, over a length $d_2$ of a few microns (typically about 10 μm and preferably comprised between 2 μm and 20 μm). Flanks 9a, 9b are preferably formed in planes perpendicular to the plane on which the loop is formed. Mode transformer 8b can then comprise a second portion $P_2$ called optimized collection portion situated following first portion $P_1$ in its direction of divergence. This second portion $P_2$ preferably has a substantially equal length to the coupling length Lc necessary to totally couple the optic wave from amplifier 1 to waveguide 2, or vice-versa. Second portion $P_2$ is preferably also divergent in the same direction as first portion $P_1$. On this second portion $P_2$, the smallest dimension $I_2$ separating the two flanks 9a, 9b of waveguide 2 can be 700 nm, whereas the largest dimension $I_3$ separating the two flanks 9a, 9b can be 1100 nm. Following on from second portion $P_2$, the distance separating the two flanks can increase until it becomes equal to the maximum lateral dimension $I_{max}$ of waveguide 2 to form a waveguide 2 with a cross-section of general rectangular shape. According to an alternative embodiment that is not represented, $I_{max}$ can be equal to $I_3$. In the region of the waveguide, first portions $P_1$ of the two mode transformers 8a, 8b are proximal and divergent in two opposite directions substantially parallel to longitudinal axis A1 (direction of propagation of the optic wave). Mode transformers 8a, 8b are preferably separated by a portion 10, preferably of constant cross-section, in the region of which the distance separating the two flanks 9a, 9b is smaller than or equal to $I_1$. The width of portion 10 in the direction of propagation of the optic wave prevents, or very greatly limits, any optic coupling between waveguide 2 and amplifier 1 so as to confine the wave in the amplifier in the vicinity of portion 10. In other words, a lateral dimension between the two mode transformers 8a, 8b will be chosen enabling the effective index of the guide to be lower than the effective index of the amplifier to prevent optic coupling, this distance typically being smaller than or equal to 500 nm.

Figure 7:
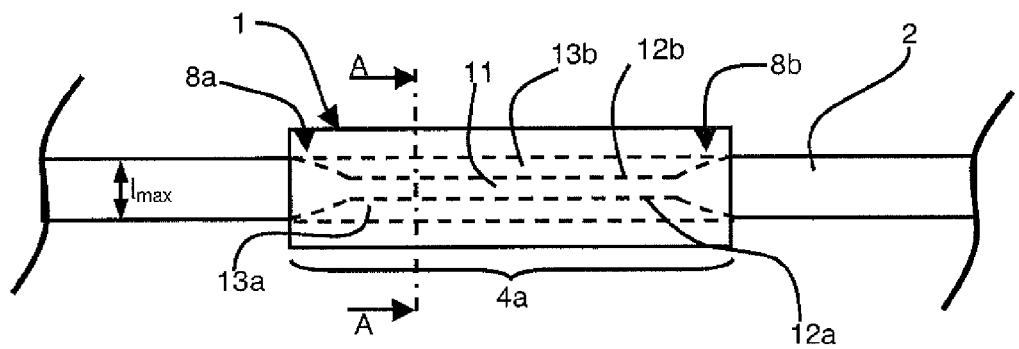
FIG. 7 illustrates a variant of FIG. 4 in which the first section comprises a section in the form of a crenel.
Figure 8:
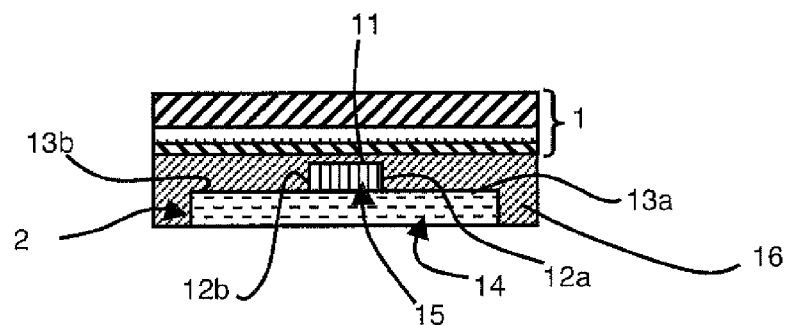
FIG. 8 illustrates a cross-sectional view along the line A-A of FIG. 7.
Figure 9:
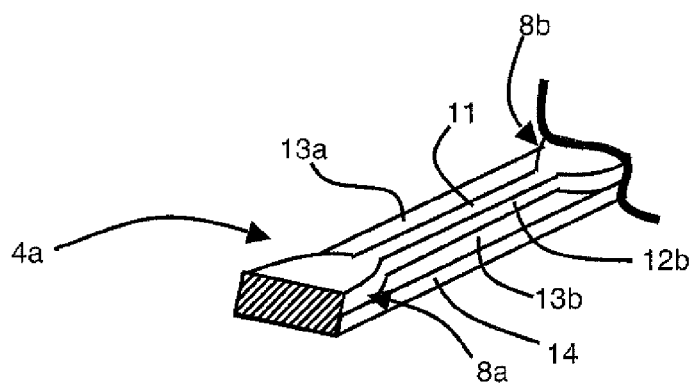
FIG. 9 illustrates a three-dimensional view of the first section of FIG. 7.

According to a particular embodiment illustrated in FIGS. 7 to 9, first section 4a of waveguide 2 preferably comprises at least one portion having a cross-section (FIG. 8), in a direction perpendicular to the direction of propagation of the optic wave (cross-section A-A of FIG. 7), that is in the form of a crenel the apex 11 of which is proximal to amplifier 1. The crenel can be defined by an apex 11, side walls 12a, 12b joining apex 11 of the crenel to the bottom 13a, 13b of crenel formed on each side of side walls 12a, 12b. In other words, at least locally, waveguide 2 can comprise a base 14 on which a protuberance 15 delineating the crenel with said base 14 is formed. Protuberance 15 in particular enables apex 11 and side walls 12a, 12b to be delineated. Base 14 and protuberance 15 forming the crenel can be formed from the same material or from different materials. In the case of use of different materials, this constitutes an advantage at fabrication level, as it is then possible to grow protuberance 15, for example made from amorphous silicon, designed to form the crenel, on base 14, thereby avoiding an additional etching step. The use of such a waveguide enables a crenel to be formed that interfaces with the amplifier and that has lateral dimensions in the region of side walls 12a, 12b that are smaller than the maximum lateral dimensions $I_{max}$ of waveguide 2. This enhances monomode coupling of amplifier 1 with waveguide 2, in particular when the distance separating the side walls, in the region of the amplifier, is comprised between 500 nm and 1100 nm.

In this particular embodiment, mode transformers 8a, 8b are formed as described in the foregoing, the only difference being that base 14 has invariable dimensions and that it is the variation of the distance separating side walls 12a, 12b which forms mode transformers 8a, 8b (the dimensions applying to the flanks described in the foregoing therefore apply in this mode to the side walls).

Apex 11 of crenel and side walls 12a, 12b of crenel are preferably covered by a layer of dielectric material in the region of the amplifier. What is meant by in the region of is "in the region of first section 4a".

This crenel structure of waveguide 2 is also called "ridge guide" in the field. The ridge guide in the region of first section 4a may comprise only the base and the protuberance forming the crenel. In the ridge guide, the effective index of the modes is higher. It is also easier by construction to reduce the number of modes supported by the guide by reducing the width of the ridge to enhance monomode coupling.

In FIG. 8, dielectric material layer 16 covering apex 11 and side walls 12a, 12b of the crenel in the region of amplifier 1 can be made from $SiO_2$. This dielectric material layer 16 improves the efficiency of the laser device by adjusting the optoelectronic characteristics (in particular the thermal and optical components) of the latter. Encapsulation of the crenel, at least in the region of its apex 11 and of its side walls 12a, 12b, by dielectric material layer 16 reduces the propagation losses linked to the roughnesses obtained when patterning of the crenel is performed. Indeed, the rougher the external surfaces of waveguide 2, the more the optic wave propagating in waveguide 2, in particular when optic coupling between waveguide 2 and amplifier 1 takes place, is liable to diffuse outside waveguide 2 thereby limiting the efficiency of the laser device. Dielectric material layer 16 then limits the diffusion effects by reducing the refractive index contrast and by filling in the asperities of waveguide 2. Dielectric material layer 16 also enables the efficiency of the laser device to be improved as it plays a role of heat conductor enabling a part of the heat generated by the laser device when the latter is operating to be diffused outside the gain area (area comprising the quantum wells). A good heat-conducting material should therefore preferably be chosen. The reduction of these two effects which are detrimental to the laser device enables the efficiency of the laser device to be greatly improved synergetically. Materials such as $SiO_2$, $Al_2O_3$, $TiO_2$, SiON, $HfO_2$, $Si_3N_4$ as dielectric material layer 16 are particularly relevant candidates to reduce these thermal and optical effects. Preferably the whole of waveguide 2, typically supported by a support substrate, is covered by dielectric material layer 16. In other words, according to an improvement, the bottom of the crenel is also covered by dielectric material layer 16. This principle can also be applied to waveguide 2 of FIGS. 2 to 4 and 6, the waveguide then also being covered by the dielectric material.

Waveguide 2 is preferably formed by a silicon base such as for example amorphous or even doped crystalline silicon. If waveguide 2 is to be functionalized, the silicon will be doped to add a new optical function. In general manner, materials with a medium refractive index can also be used, such as for example nitrided compounds such as $Si_3N_4$, SiON, or even $Al_2O_3$. Silicon has a refractive index situated around 3.5, and silica has a refractive index comprised between 1.4 and 1.5, so what is meant by medium refractive index is a refractive index preferably comprised between 1.8 and 1 In the case where base 14 and protuberance 15 are made from different materials, base 14 can be made from silicon and protuberance 15 is preferably made from a nitrided compound.

Figure 10:
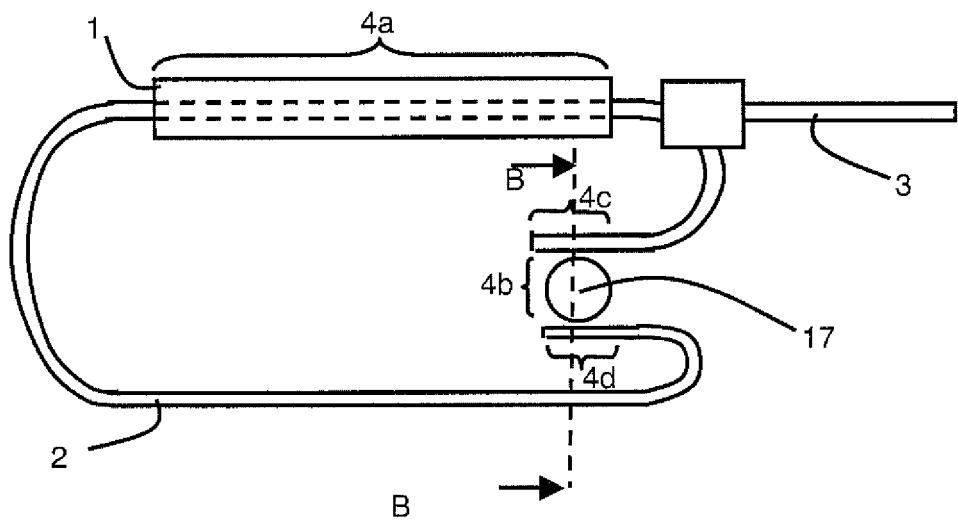
FIG. 10 illustrates a laser device equipped with an additional microresonator.

As in FIG. 10, one of the functionalities that can be added to the laser device is a microresonator 17 to perform mode filtering of the optic wave formed in the region of a second section 4b of waveguide 2, distinct from first section 4a. The object of microresonator 17 is preferably to favour a single optic mode constituted by photons generated by amplifier 1. It then plays the role of a filter able to enhance a particular mode of the circular laser cavity. Microresonator 17 is therefore arranged between third section 4c and fourth section 4d, and is optically coupled to these third and fourth sections 4c, 4d so as to let at least one considered optic mode pass. The sections are arranged so as to be compatible with the direction of propagation of the photons and to enable the latter to pass from one section to the other.

In order to enhance a particular mode, it is possible to dimension microresonator 17 with respect to third and fourth sections 4c, 4d so that resonator 17 has a different effective index from that of third and fourth sections 4c, 4d. The person skilled in the trade will be able to adjust these effective indexes as he wishes according to the mode of the optic wave which he will seek to enhance according to the requirement specifications of the laser device.

This dimensioning can be performed at the design stage of the device. However this solution implies that the device will be limited to always enhancing the same mode. Thus, in certain applications, it may for example be sought to adjust the wavelengths, this then resulting in a need to adapt the device in order to be able to enhance the selected mode. To meet this requirement, the microresonator can comprise a modulation system of its effective index. The microresonator can be doped and its effective index can vary for example by carrier injection or depletion. Such a modulation system can be implemented by forming a microresonator 17 having a P-doped and N-doped silicon base. Then, by forming electrodes respectively associated with the P-doping and N-doping, it is possible, by biasing these electrodes, to make the effective index of microresonator 17 vary by modifying the latter. By making the effective index of microresonator 17 vary, the properties of the optic coupling of the latter with third and fourth sections 4c, 4d are changed.

Figure 11:
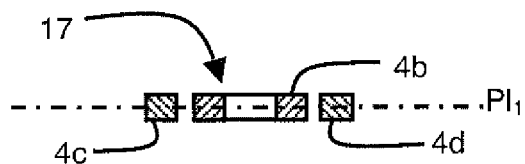
FIGS. 11 to 15 illustrate different embodiments of the microresonator.
Figure 12:
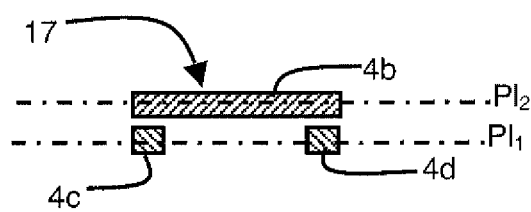

According to a particular embodiment illustrated in FIGS. 10 to 12, second section 4b of waveguide 2 is in the form of a ring or of a disk respectively coupled to third and fourth sections 4c, 4d of waveguide 2 distinct from first section 4a. The third and fourth sections are preferably parallel. According to the uses, the person skilled in the trade will choose the suitable structure (disk/ring), although the microdisk is easier to implement at fabrication level. According to a particular embodiment of microresonator 17, second, third and fourth sections 4b, 4c, 4d are formed in the same plane $Pl_1$ (FIG. 11). According to a variant, third and fourth sections 4c, 4d are formed in the same plane $Pl_1$, parallel to an offset plane $Pl_2$ and comprising second section 4b (FIG. 12). FIGS. 11 and 12 represent two alternative embodiments in cross-sectional view along B-B of FIG. 10. Second section 4b then comprises portions respectively facing third and fourth sections 4c, 4d so as to perform optic coupling of the resonator with third and fourth sections 4c, 4d (in FIG. 12, these portions are arranged above third and fourth sections 4a, 4d).

In the case where second, third and fourth sections 4b, 4c, 4d are formed in the same plane, the latter are preferably formed from a silicon base.

In the case where third and fourth sections 4c, 4d are formed in the same plane parallel to an offset plane comprising second section 4b (FIG. 12), third and fourth sections 4c, 4d are preferably silicon-based, and second section 4b forming microresonator 17 is formed in the same manner as the III-V heterostructure. Microresonator 17 is preferably formed in the same plane as amplifier 1 so as to be produced during the same fabrication steps. The advantage of III-V microresonator 17 is to enable the gain to be improved. In addition, according to the application, it is possible to apply a voltage in the region of the III-V material of microresonator 17 so as to absorb the photons. Absorption of photons advantageously enables ultra-fast information encoding. It is thus possible to produce laser devices with intra-cavity modulation.

Figure 13:
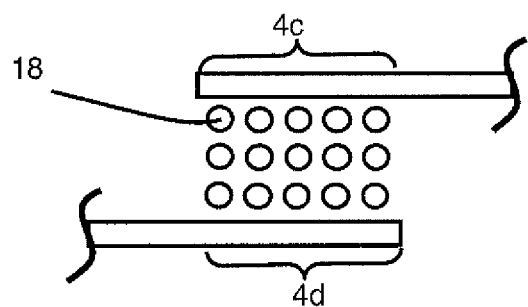
Figure 14:
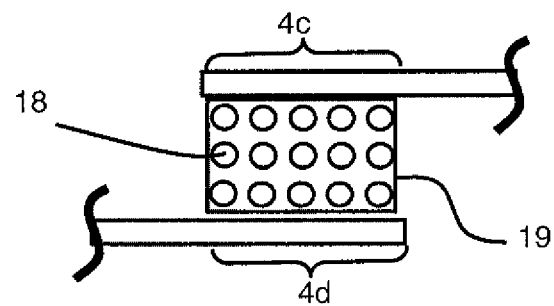

According to another embodiment, microresonator 17 is a photonic crystal. A photonic crystal can be obtained by patterning a solid section, for example made from silicon. FIGS. 13 and 14 illustrate patterning in the form of bars 18, preferably substantially perpendicular to the plane in which the waveguide is formed. These bars 18 can be obtained from a slab that is partially etched (FIG. 14) or totally etched (FIG. 13). In the case where the slab is totally etched, bars 18 are separated from one another over the whole thickness of second section 4b, and in the case where the slab is partially etched, bars 18 are joined by a base 19 formed from the same material as said bars, bars 18 and base 19 being formed in a single part. Microresonator 17 of FIGS. 13 and 14 is optically coupled to third and fourth sections 4c, 4d.

Figure 15:
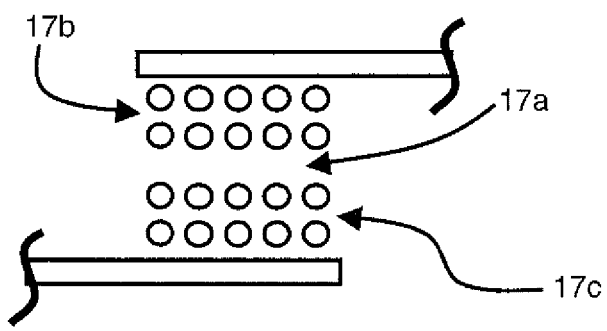

According to an alternative embodiment illustrated in FIG. 15, it is possible to add in the photonic crystal a free area able to accumulate the optic wave before transmitting it respectively to third and fourth sections 4c, 4d. In FIG. 15, free area 17a of resonator 17 is situated between two photonic crystal lattices 17b, 17c. This free area 17a can be formed by omission of a bar line.

Figure 19:
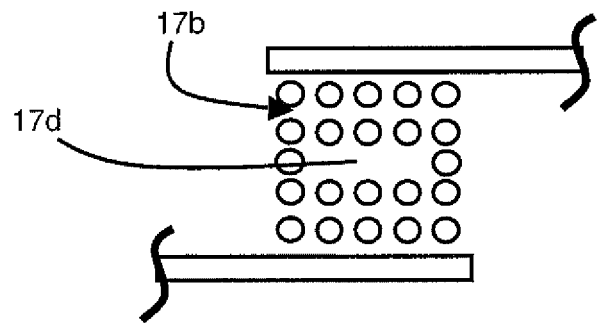
FIG. 19 illustrates an alternative embodiment of a microresonator.

A variant of FIG. 15 is illustrated in FIG. 19. In this variant, the photonic crystal comprises a cavity 17d located in the middle of photonic crystals 17b.

The microresonator described above in particular enables mode filtering to be performed and the quality factor to be increased. According to the applications, it also enables a monomode laser device to be produced. The microresonator preferably has dimensions of about 20 μm to 30 μm.

The bars of the photonic crystals can be arranged by meshes that can be square, triangular, etc. In FIGS. 13 to 15, the bars are arranged in the form of square meshes, i.e. in the form of a matrix of lines and columns. The lines are then oriented in the direction of third and fourth sections 4c, 4d. A free area can be formed by omission of a line (FIG. 15) or of a part of a line (FIG. 19). According to a variant, two adjacent lines will be formed so as to place the bars of two lines in staggered manner.

Although the photonic crystals were defined above as being bars or bars associated with a base, they can also be formed by holes which can be pass-through or not, for example formed in a solid silicon section.

Figure 16:
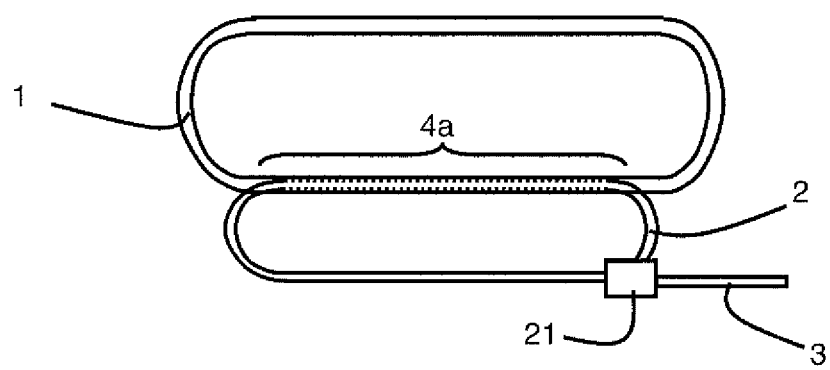
FIG. 16 illustrates an alternative embodiment of the laser device.

In FIG. 16 illustrating an alternative embodiment applicable in combination with the features described above, amplifier 1 is in the form of a loop, a single portion of the loop of amplifier 1 being arranged facing first section 4a of waveguide 2. In FIG. 16, the loop associated with waveguide 2 and the loop associated with amplifier 1 are formed in substantially parallel planes, and are shifted so as to obtain partial overlap of waveguide 2 and amplifier 1. This enables the portion of loop of amplifier 1 to perform optic coupling with waveguide 2 in the region of first section 4a, while at the same time keeping an amplifier with good power performances on account of its length and its loop shape. The loop shape of the amplifier enables a Vernier effect, i.e. the modes of two waves to be made to coincide in order to achieve a monomode laser device. In order to enhance a single mode of the optic wave, the loops can have an identical effective index and a different length, or an identical length with a different effective index.

Figure 17:
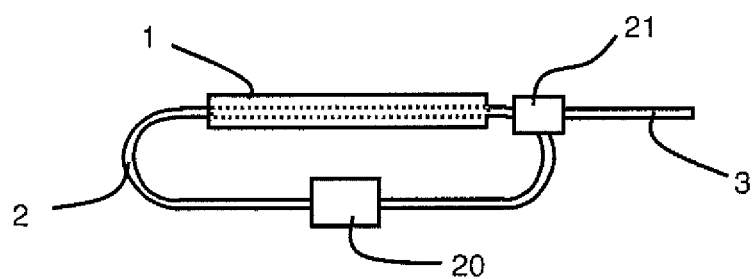
FIG. 17 illustrates a laser device comprising a semiconductor optical amplifier.

According to another functionalization illustrated in FIG. 17, a semiconductor optical amplifier 20 optically coupled to waveguide 2 can be added on an available section (distinct from section 4a) of waveguide 2. Such a semiconductor optical amplifier (SOA) 20 can be of smaller length than amplifier 1 as its sole purpose is to amplify the wave signal, and that to do so it only requires a simple electric pumping. Such a semiconductor optical amplifier (SOA) 20 also enables information to be modulated, i.e. encoded for example by electroabsorption by applying a control voltage to the SOA and adjusting it. It can be coupled to waveguide 2 using mode transformers that are associated with it in the same way as those of amplifier 1 designed to generate the photons. The section of waveguide 2 coupled to semiconductor optical amplifier 20 can also have a crenel-shaped cross-section as described above. SOA 20 can be formed by a stack identical to that of amplifier 1. The use of a SOA is not limited to the embodiment of FIG. 17, the SOA can in fact be used in all the embodiments and variants described in the foregoing and in the following.

As illustrated in FIGS. 2, 10, 16, 17, loop-shaped waveguide 2 can be coupled to an output waveguide 3 to extract a part of the optic wave propagating in waveguide 2 in the form of a laser beam. The laser beam can then be transferred via output waveguide 3 to a device able to use it, for example to an optic fibre enabling the laser beam to be transmitted to an associated remote device.

In FIGS. 2, 10, 16, 17, the laser beam is extracted from the loop of waveguide 2 by a beam divider 21 connected to output waveguide 3. In FIG. 2, divider 21, which is a multimode interferometer (MMI), is illustrated in detail. A MMI enables an input beam to be divided into N output beams. The MMI used can be of the type of those described in the publication "Optical Multi-Mode Interference Devices Based on Self-Imaging: Principles and Application" by Lucas B. Soldano et al. Published in the "Journal of Lightwave Technology vol. 13 no 4" of April 1995 pages 615 to 627. For the sake of clarity in the other FIGS. 10, 16, 17, reference 21 is simply represented by a block, even if a MMI is involved.

Figure 18:
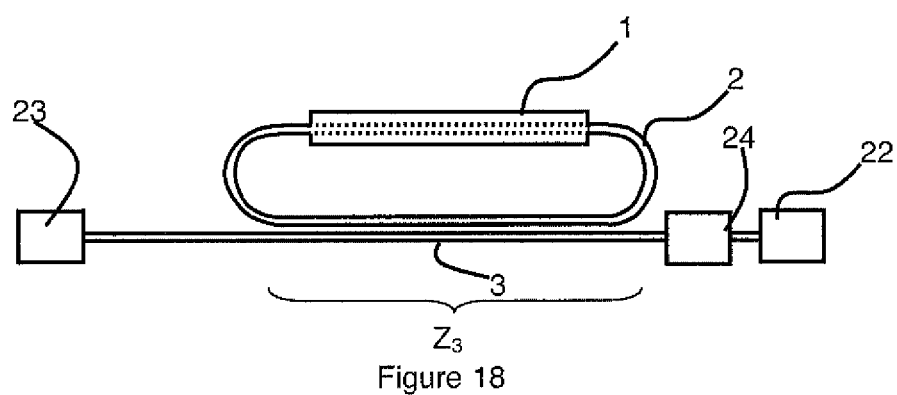
FIG. 18 illustrates the laser device equipped with an output waveguide coupled to the laser cavity.

According to a variant of beam divider 21 applicable to the different embodiments and illustrated in FIG. 18, output waveguide 3 and loop-shaped waveguide 2 are formed in the same plane and are separated by an ideal distance enabling optic coupling thereof in the region of two substantially parallel sections. This ideal distance enables the coupling rate, i.e. the power collected at each turn of the photon, and therefore the quality factor of the assembly, to be fixed. This divider can be applied to all the embodiments instead of the MMI.

Waveguide 2 and amplifier 1 can be produced on different substrates. The substrates are then bonded to one another, for example by molecular bonding. The waveguide is preferably formed on a SOI substrate.

The different design dimensionings of waveguide 2 and amplifier 1 can be obtained by simulation methods using for example the RSOFT© software sequence. For example, to compute the eigenmodes and propagation constants, or in equivalent manner the associated effective indexes, the finite elements method of the RSOFT© FEMSIM module can be used. The coupling efficiency can be calculated using the Beam Propagation Method (BPM) as defined in the RSOFT© BeamProp module.

According to a variant illustrated in FIG. 18, output waveguide 3 comprises a nanostructured output array 22 designed to be coupled with an optic fibre (not shown). This array 22 can be formed by trenches formed in the output waveguide perpendicularly to the direction of propagation of the wave, in other words perpendicularly to the longitudinal axis of output waveguide 3. To define array 22, the Finite-Difference Time-Domain (FDTD) method of the RSOFT© Fullwave module can be used.

Output waveguide 3 can also comprise a control photodiode 23 enabling the incident laser beam to be measured. In FIG. 18, this photodiode 23 is opposite to array 22.

Output waveguide 3 can further comprise a modulator 24 to encode information arranged between a coupling area $Z_3$, between waveguide 3 and waveguide 2, and the output of the laser device (before array 22 in FIG. 18). Such a modulator 24 can for example be of electroabsorption or Mach Zehnder type. The modulator can comprise III-V materials and/or silicon.

The modulator 24 and array 22 can be implemented at the output of the MMI.

The laser device as described enables complex optic beam management functions such as multiplexing, demultiplexing, modulation, spectrum routing etc., to be integrated on the same chip. These functions can be dedicated to very short-distance optical links (on the millimeter scale) or long-distance optical links which may reach several kilometers. These optic functions can solve the problems arising from the increase of the interconnection bus throughput.

The invention claimed is:

1. A laser device comprising:
   a silicon-based waveguide forming a loop, the silicon-based waveguide comprising a first section, arranged in a first plane, and a second section;
   a III-V heterostructure amplifier designed to generate photos and optically coupled to the silicon-based waveguide, the III-V heterostructure amplifier arranged in a second place and facing the silicon-based waveguide only in the region of the first section, the first and second planes being substantially parallel and offset from each other;
   a first mode transformer and a second mode transformer, each of the transformers formed in the silicon-based waveguide at a respective end of the first section so as to perform optic coupling between the silicon-based waveguide and the III-V heterostructure amplifier, the width of the first section being smaller, at least over a portion of the first section, than the width of the silicon-based waveguide on each side of the first section, the generated width contraction delineating the first and second mode transformers; and a functionalization system arranged in the second section of the silicon-based waveguide that is not covered by the III-V heterostructure amplifier.

2. The device according to claim 1, wherein the III-V heterostructure amplifier has a loop shape arranged in the second plane, a single portion of the loop of the III-V heterostructure amplifier being arranged facing the first section of the silicon-based waveguide.

3. The device according to claim 1, wherein the functionalization system is a microresonator configured for mode filtering.

4. The device according to claim 3, wherein the microresonator comprises a modulation system of an effective index thereof.

5. The device according to claim 3, wherein the microresonator has a ring shape or a disk shape, the microresonator being optically coupled to third and fourth sections of the silicon-based waveguide distinct from the first section.

6. The device according to claim 5, wherein the second, third and fourth sections are formed in the same plane.

7. The device according to claim 5, wherein the third and fourth sections are formed in a plane parallel to an offset plane comprising the second section.

8. The device according to claim 3, wherein the microresonator is a photonic crystal.

9. The device according to claim 1, wherein the silicon-based waveguide is coupled with a semiconductor optical amplifier over a section of the silicon-based waveguide different from the first section.

10. A laser device comprising:

a silicon-based waveguide forming a loop, the silicon-based waveguide comprising a first section, arranged in a first plane, and a second section;

a III-V heterostructure amplifier designed to generate photons and optically coupled to the silicon-based waveguide, the III-V heterostructure amplifier arranged in a second plane and facing the silicon-based waveguide only in the first section of the silicon-based waveguide that has the loop shape and that is optically coupled to the III-V heterostructure amplifier, the first section being provided with first and second ends, and the first and second planes being substantially parallel and offset from each other;

a first mode transformer formed in the silicon-based waveguide at the first end of the first section so as to perform optic coupling between the waveguide and the amplifier;

a second mode transformer formed in the silicon based waveguide at the second end of the first section so as to perform optic coupling between the waveguide and the amplifier, wherein the first section comprises a portion having a width smaller than the width of the waveguide on each of the first and second ends, the generated width contraction from the first end to the portion delineating the first mode transformer, and the generated width contraction from the second end to the portion delineating the second mode transformer; and a functionalization system arranged in the second section of the silicon-based waveguide that is not covered by the III-V heterostructure amplifier.

* * * * *